United States Patent [19]

Haken et al.

[11] Patent Number: 4,524,431
[45] Date of Patent: Jun. 18, 1985

[54] HIGH-SPEED NONVOLATILE MEMORY ARRAY

[75] Inventors: Roger A. Haken; William E. Feger, both of Richardson, Tex.

[73] Assignee: Texas Instruments Incorporated, Dallas, Tex.

[21] Appl. No.: 344,587

[22] Filed: Feb. 1, 1982

[51] Int. Cl.$^3$ ............................................. G11C 11/40
[52] U.S. Cl. .................................. 365/222; 365/202; 365/210
[58] Field of Search ............... 365/222, 202, 210, 207, 365/196

[56] References Cited

U.S. PATENT DOCUMENTS 4,433,395  2/1984  Iyehara et al. ...................... 365/222

Primary Examiner—Terrell W. Fears
Attorney, Agent, or Firm—William E. Hiller; James T. Comfort; Melvin Sharp

[57] ABSTRACT

A memory array using nonvolatile memory elements. Preferably multi-dielectric transistors are used to provide nonvolatile information storage. Good write speed is attained by providing a relatively low barrier to carrier injection. To compensate for the resulting low storage time, periodic refresh logic is provided, so that all cells in the array are refreshed at a given clock period, e.g. one second. To compensate for the changing characteristics of the nonvolatile transistors during their storage lifetime, a reference voltage generator is provided which consists of two nonvolatile memory cells programmed in opposite states, together with a resistive network for averaging their output.

7 Claims, 11 Drawing Figures

HIGH-SPEED NONVOLATILE MEMORY ARRAY

BACKGROUND OF THE INVENTION

The present invention relates to a nonvolatile memory array.

For NVRAMs using tunnelling to store charge in dielectric traps, there is a trade-off between write speed and storage time, because the same potential barriers which retard leakage of trapped charge into the channel also impede fast writing. (Avalanche-assisted write mechanisms partly avoid this dilemma, but only at the expense of greatly reduced device lifetime. The lifetime of an avalanche-write cell will typically be on the order of $10^5$ cycles, as opposed to $10^{14}$ cycles for the cell of the present invention.) Thus if a nonvolatile memory is to attain write speeds remotely comparable to those of a DRAM, relatively short nonvolatile storage times must be tolerated. For example, a memory having a 200 nsec write time will have a nonvolatile storage time down around 3 days.

However, nonvolatile memory arrays having such storage lifetimes retain most of the advantages of nonvolatile memory. That is, for many applications the trade off between storage time and write speed can desirably be exploited, if the result is a memory array which appears to have read and write characteristics closer to those of a conventional SRAM.

It is thus an object of the present invention to provide a nonvolatile memory array optimally incorporating memory cells which have good write speed and reduced nonvolatile storage time.

A particular difficulty in reading multi-dielectric type nonvolatile storage transistors which are well along in their storage lifetime is that the degradation of the two states of stored information is not symmetrical. That is, a transistor having trapped holes in its dielectric will degrade at a different rate than a transistor having trapped electrons in its dielectric. Thus, the provision of a reference voltage which will optimally discriminate between $+V_{TH}$ program states and $-V_{TH}$ program states is critical.

It is a further object of the present invention to provide a reference voltage generator for nonvolatile memories which will accurately provide a reference voltage which varies during the storage lifetime of nonvolatile transistors to provide a constantly optimized reference voltage for discrimination between $+VTH$ and $-VTH$ program states.

SUMMARY OF THE INVENTION

To achieve the foregoing objects and other advantages, the present invention provides an array of multi-dielectric nonvolatile-storage memory cells, having a short storage lifetime and a fast write speed.

Preferably, the specific memory cells used in the array of the present invention are as described and claimed in U.S. patent application Ser. No. 344,399, filed Feb. 1, 1982, now U.S. Pat. No. 4,472,791 issued Sept. 18, 1984, which is hereby incorporated by reference.

The present invention provides a user controlled periodic refresh mechanism, so that all cells in the memory array are refreshed, row by row, periodically. For convenience, a refresh time of around one second is preferred, since this avoids the need for huge counters and ensures that the nonvolatile information storage cells will always be near the beginnings of their storage lifetimes when power is cut off. However, other refresh intervals may of course be selected.

The present invention also provides a reference voltage generator, comprising two nonvolatile information storage cells programmed into opposite threshold voltage states, with the output of these two cells being averaged by a resistive divider.

According to the present invention, there is provided a memory array comprising:

a matrix of nonvolatile memory cells arranged in rows and columns, each said cell comprising a multi-dielectric transistor having programmable first and second threshold voltage states;

refresh means, connected to said matrix for reading out and rewriting said cells of said matrix, one row at a time;

said refresh means being periodically actuated.

BRIEF DESCRIPTION OF THE DRAWINGS

The present invention will be described with reference to the accompanying drawings wherein.

DESCRIPTION OF THE PREFERRED EMBODIMENTS

Figure 9:
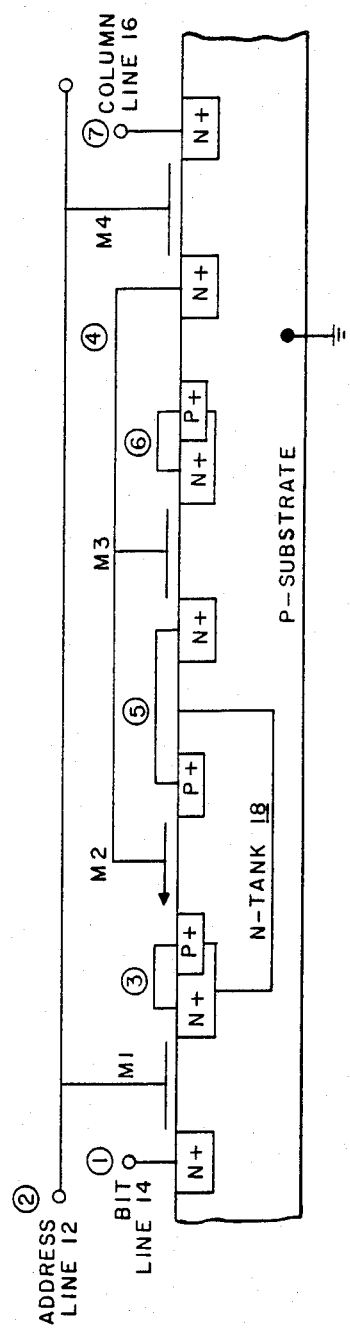
FIG. 9 shows an example of a nonvolatile memory cell which may be used in the array of the present invention.

The array organization of the present invention will be described in connection with a 3-terminal CMOS nonvolatile cell, as shown in FIG. 9. However, the present invention is also applicable to a great variety of other nonvolatile memory cells.

The operation of the memory cell in the preferred embodiment is as follows:

First, if a $+V_{TH}$ is to be written, the address line 12 is raised (to 15 volts) to open isolation transistors M1 and M4. Bit line 14 is set to zero volts, and column line 16 is set to $+15$ volts. Thus $+15$ volts (less the $V_{TH}$ of M4) appears on the gates of M2 (the nonvolatile transistor) and M3 (the read-enable transistor). Since M1 and M3 are both hard on, the source and drain of M2 are both at zero volts. No current flows through transistor M2 (which is off), but a large voltage drop has been created between its gate and channel. Trapped charge is therefore injected into the dielectric structure by tunneling, according to the well known operation of multiple-dielectric devices.

To write $-V_{TH}$, the address line 12 is again taken high, but now the column line 16 is taken low while the bit line 14 is taken high. The gates of M2 and M3 are therefore at zero volts, and the N tank 18 (the channel region of transistor of M2) is held at +15 volts less $V_{TH}$ of M1. Since M3 is held off, no substantial current flows through transistor M2, and the full write voltage appears across the dielectric of M2, so that fast writing occurs. The large inverted voltage which has been created between the channel and gate of transistor M2 now causes injection of the opposite carrier type, so that the threshold voltage of transistor M2 becomes negative. The effect of the write operation, using the parameters described herein for the preferred embodiment, is to vary the $V_T$ of M2 between approximately ±2 volts. However, the programmed $V_T$ values are not critical and need not be symmetric opposites.

To read the stored information, the address line 12 is again related to a high potential, and a relatively small potential of e.g. 8 volts (which must in any case be greater than the N-channel $V_{TH}$) is applied to the column line 16. Thus, transistor M3 is turned on and the source of M2 (at contact 5) is pulled to near ground voltage. The bit line 14 is connected to a load (at about 15 volts) and a sense amplifier, so that the current flow through transistor M2, and thus its programmed threshold state, is sensed. If the $V_T$ of M2 has been programmed to a $+V_{TH}$ state (e.g. +2 volts), the huge $K_p$ of M2 means that the tank will be pulled to slightly less than M2's gate voltage when the read voltage is applied. Thus M2 will be turned on, and will pull bit line 14 down. (Typically bit line 14 might be pulled down to about 10 V). Conversely, if transistor M2 has been programmed to −2 volts, M2 will hardly be turned on when the read voltage is applied, and the tank will float up to around 12 volts.

Note that in both $V_{TH}$ states a mild read-enhance occurs, since the voltage drop across M2's dielectric is favorable to the injection of the carrier type which would exaggerate the $V_{TH}$ state of M2.

The read voltage is selected simply to provide a bit line current which varies with the $V_{TH}$ state of M2. For other device parameters than those of the preferred embodiment, other read voltage valves can be used.

Figure 7A:
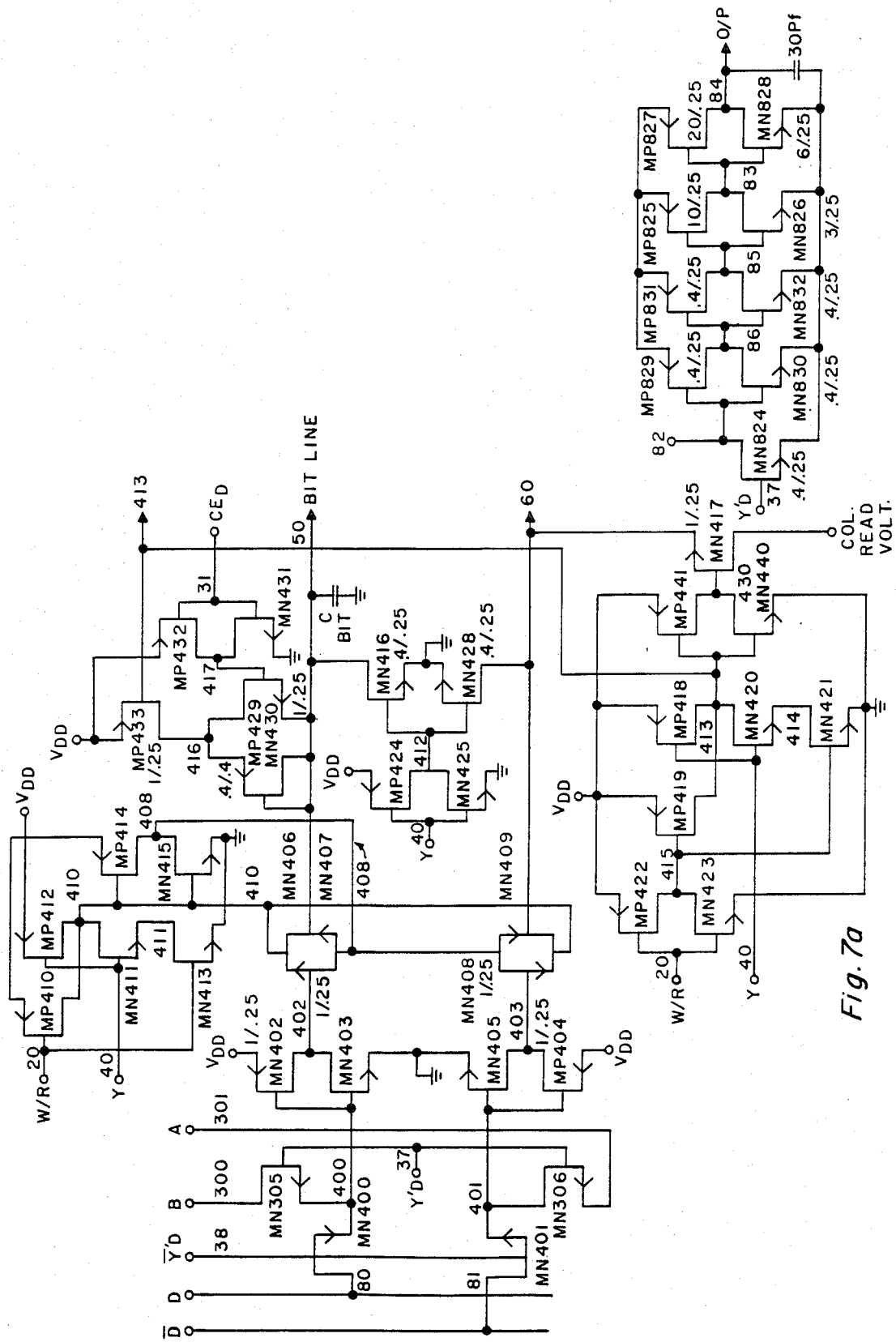
FIGS. 7a and 7b are detailed circuit diagrams of the column logic.
Figure 7B:
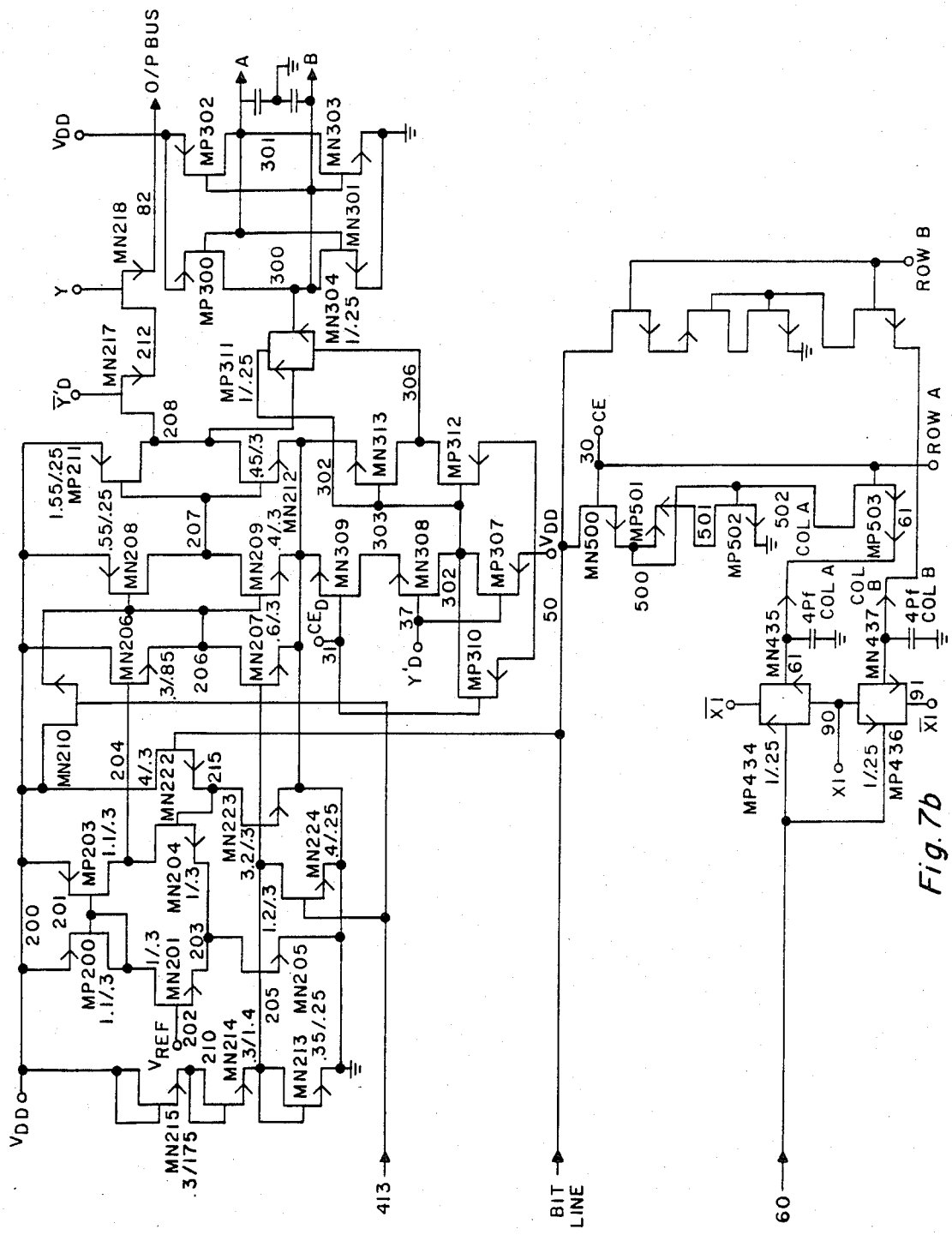
Figure 8:
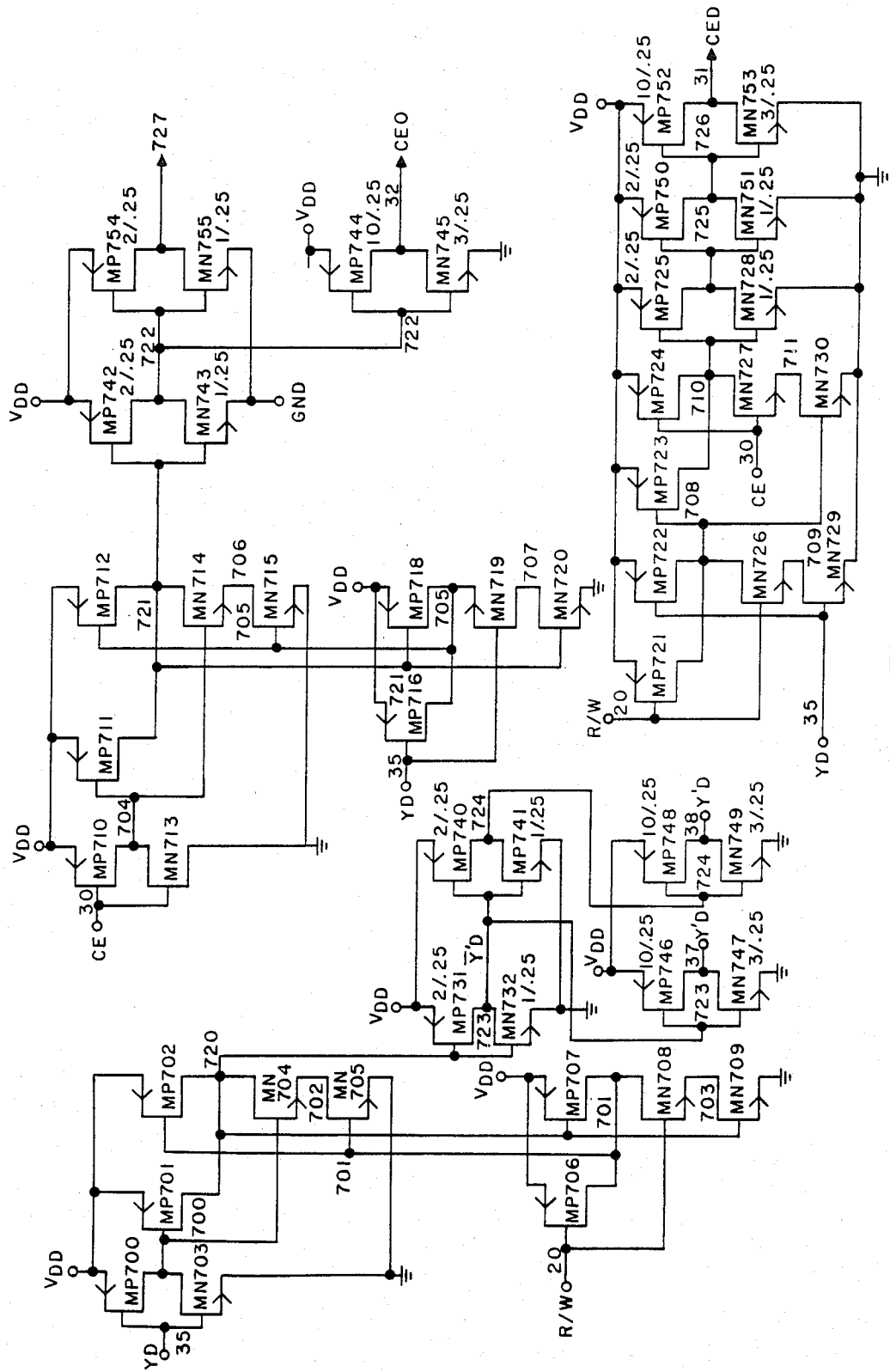
FIG. 8 is a diagram of the chip control logic used to control an array of the memory cells of the present invention.

The output of a multi-dielectric memory cell, as used in the present invention, is essentially analog. To provide optimal sensing of the analog output, a comparator is used to compare the output of a selected memory cell to a reference voltage. The output of the comparator is used to provide a digital data output, and (only during periodic refresh, but not during a normal read cycle) also drives a latch, which in turn drives the bit and column lines to enhance the information in the cell just read. A simplified circuit diagram of the comparator is shown in FIGS. 7a and 7b. As is conventional in the CMOS design art, N-channel MOSFETs are shown with an arrow on the source pointing away from the channel region, and P-channel MOSFETs are shown with an arrow on the source side pointing toward the channel region. In neither case is the gate/channel separation explicitly shown. Note that the comparator shown includes multiple amplifying output stages, so that the data out signal is clamped to $V_{DD}$ or ground, i.e. a digital output signal is provided.

Figure 2:
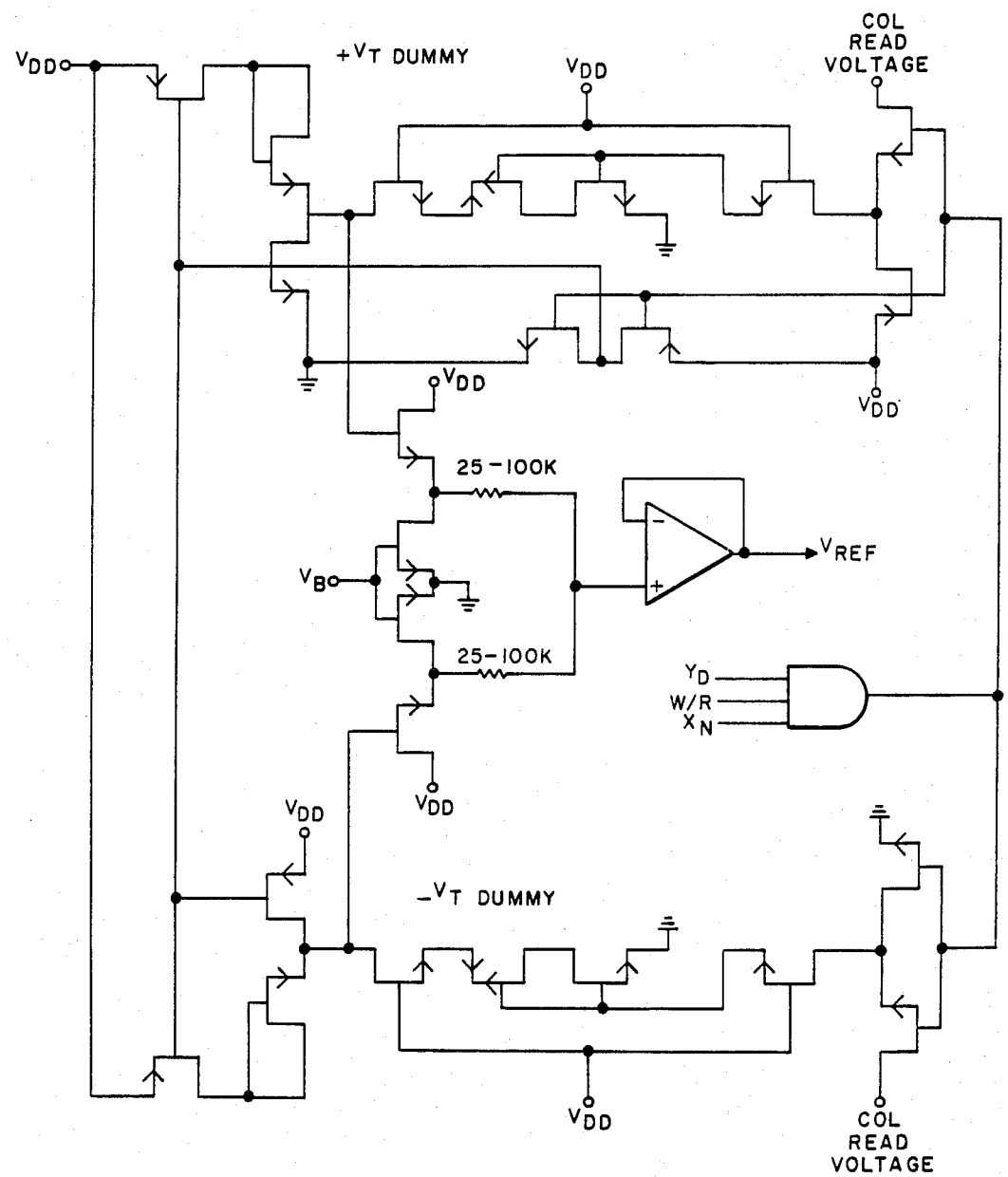
FIG. 2 is a schematic circuit diagram of the reference voltage generator of the present invention.
Figure 6A:
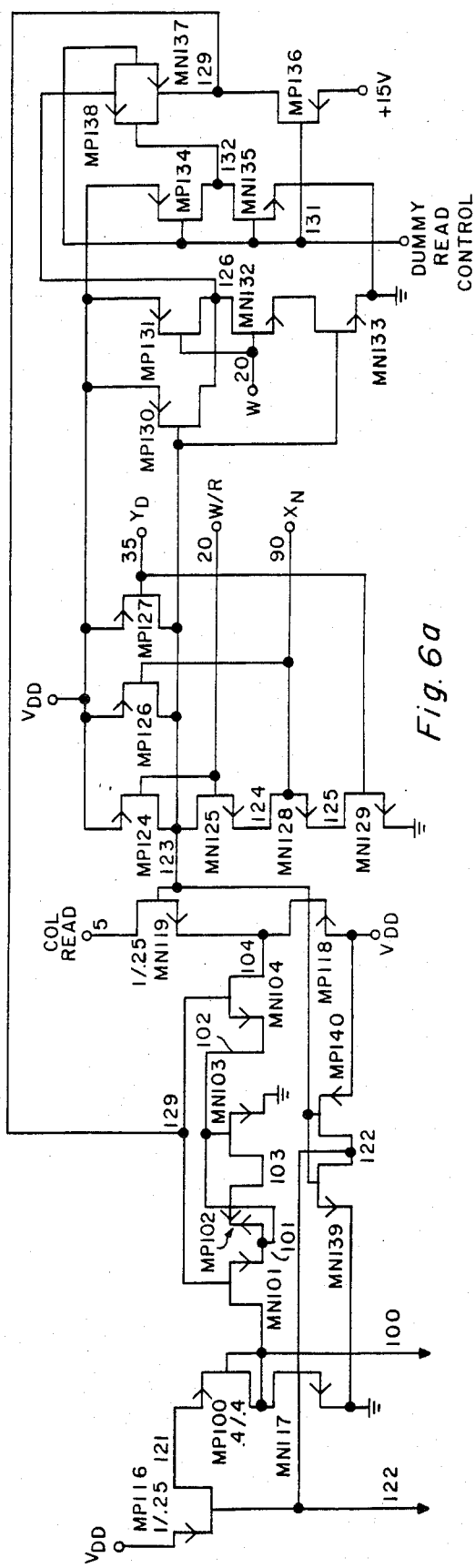
FIGS. 6a and 6b are detailed circuit diagrams of the presently preferred embodiment of a reference voltage generator according to the present invention.
Figure 6B:
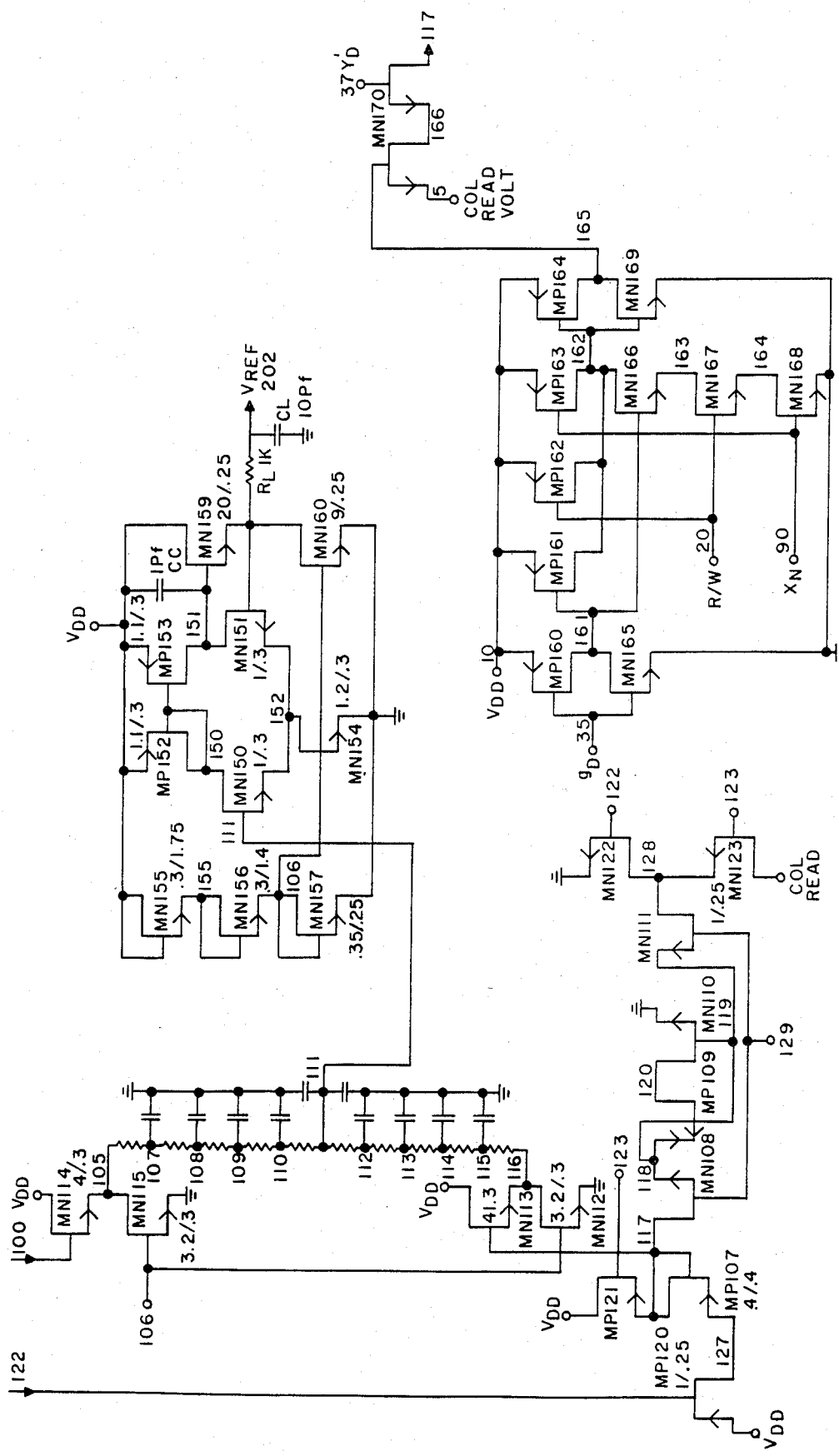

The reference voltage provided to the comparator is generated by a reference voltage generator such as shown generally in FIG. 2 and in greater detail in FIGS. 6a and 6b. The memory cells like those in the storage matrix are provided. These cells are always maintained in opposite states, so that the average of their output signals always provides an optimal reference voltage. Note that, in place of the connection of address line 12 to each memory cell in the array, power supply voltage $V_{DD}$ is provided to the two isolation transistors within each memory cell of the reference voltage generator. The NAND gate provides a high voltage to the read/rewrite select circuits selectively. Thus, when a reference voltage is required, the column read voltage (which is about 8 volts) is provided to the gates of the NV transistor and the read enable transistors in each memory cell, and both states of memory cell outputs are provided to the voltage-averaging circuit. Implanted resistors and load elements, are used to provide an even average of the output voltages. (The tank implant is used to form implanted resistor areas, of about 1–2 kΩ/□.) A further op amp stage connected in a unity gain configuration is used to buffer the reference voltage output.

For NVRAMs using tunnelling to store charge in dielectric traps, there is a trade-off between write speed and storage time, because the same potential barriers which retard leakage of trapped charge into the channel also impede fast writing. (Avalanche-assisted write mechanisms partly avoid this dilemma, but only at the expense of greatly reduced device lifetime.) Thus if a nonvolatile memory is to attain write speeds remotely comparable to those of a DRAM, relatively short nonvolatile storage times must be tolerated. For example, a memory having a 200 nsec write time may only have a nonvolatile storage time down around 3 days.

For short retention NVRAMs, e.g. those having a shortage time of less than thirty days, periodic refresh is necessary. A suitable refresh time would be, e.g., of the approximate order of 1 second. If refresh time is too short, the excessive number of rewrites would threaten to exercise the array so often that cell lifetime would needlessly be wasted. Conversely, a very long refresh time would require inconveniently long counting sequences. For maximum speed of the refresh cycle (and therefore maximum availability of the memory chip) the periodic refresh is done row by row, rather than bit by bit. Bit by bit refresh would be exceedingly slow, especially for a large memory, but external refresh circuitry is only adequate for bit by bit refresh. The circuitry needed to achieve on-chip control of periodic refresh is of the order of 20 additional transistors per column. An extra control line (the rewrite line $Y_D$) is also required for periodic refresh. Note that the column circuitry can be laid out by step and repeat, since only one design is used.

Figure 4:
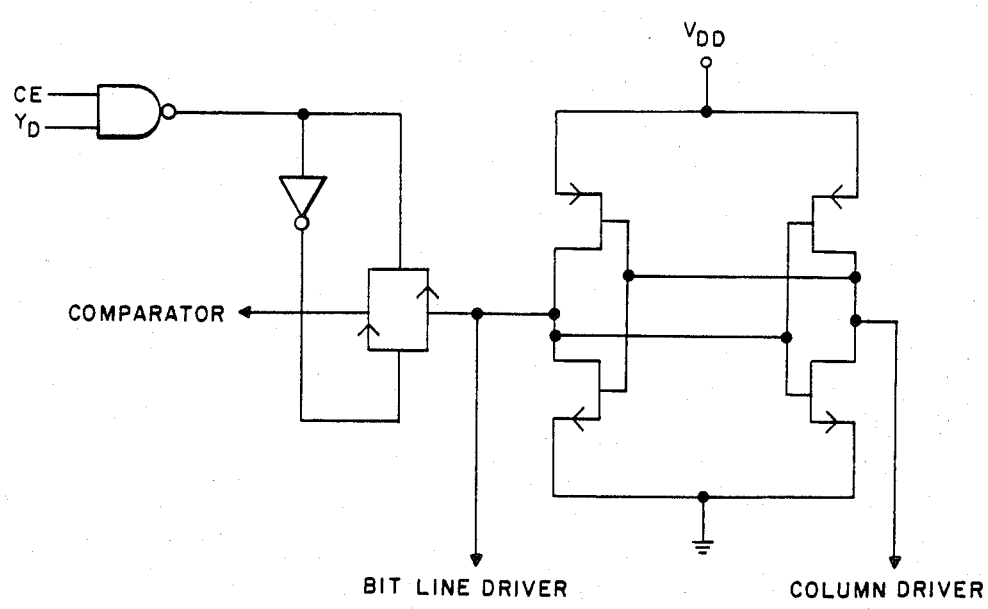
FIG. 4 is a schematic view of the latch used to permit rewriting of information in a memory cell to be refreshed.

A circuit diagram of the latch used to provide rewrite of a memory cell to be refreshed is shown in FIG. 4. The data output of the comparator drives a conventional CMOS cross-coupled latch, if the latch is enabled by the CE and $Y_D$ lines, to drive the bit and column lines appropriately to rewrite the read information.

Figure 1:
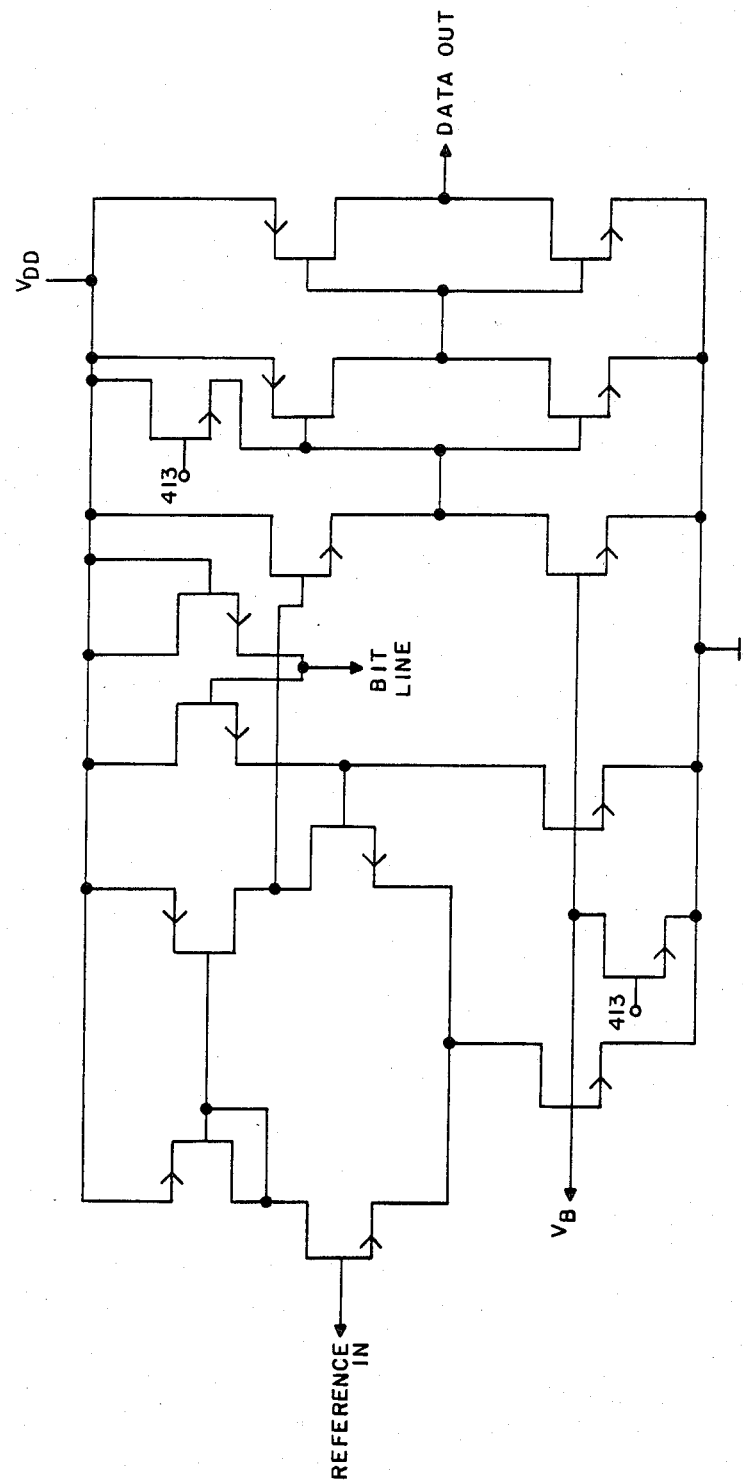
FIG. 1 is a schematic circuit diagram of a comparator used in the sense operation of the array of the present invention.
Figure 3:
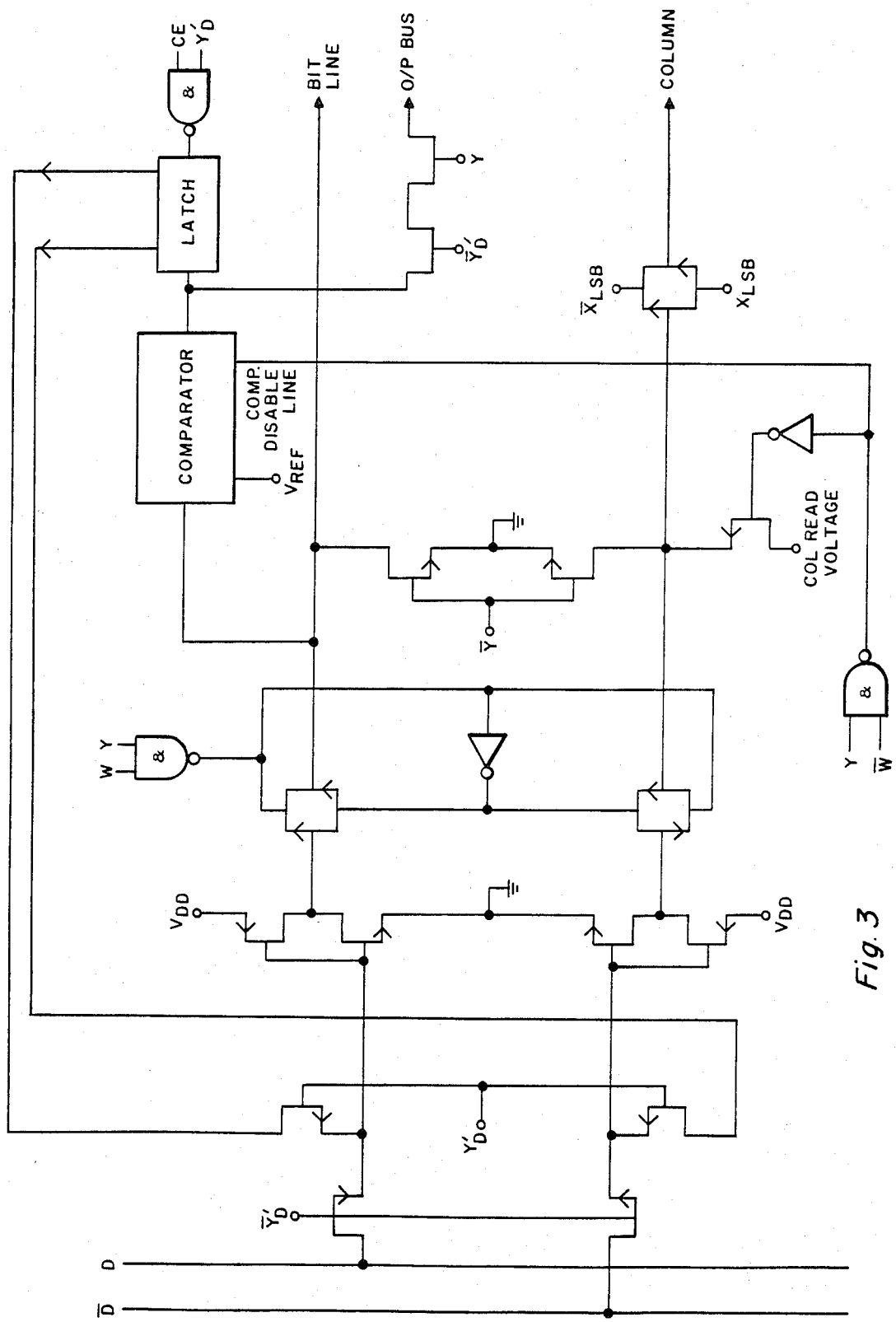
FIG. 3 is a schematic view of the column logic and rewrite circuitry, used to implement the periodic refresh cycle in the present invention.

FIG. 3 provides an overview of the column logic and rewrite circuitry. Note that the comparator of FIG. 1 and the latch of FIG. 4 are shown as blocks.

Figure 5:
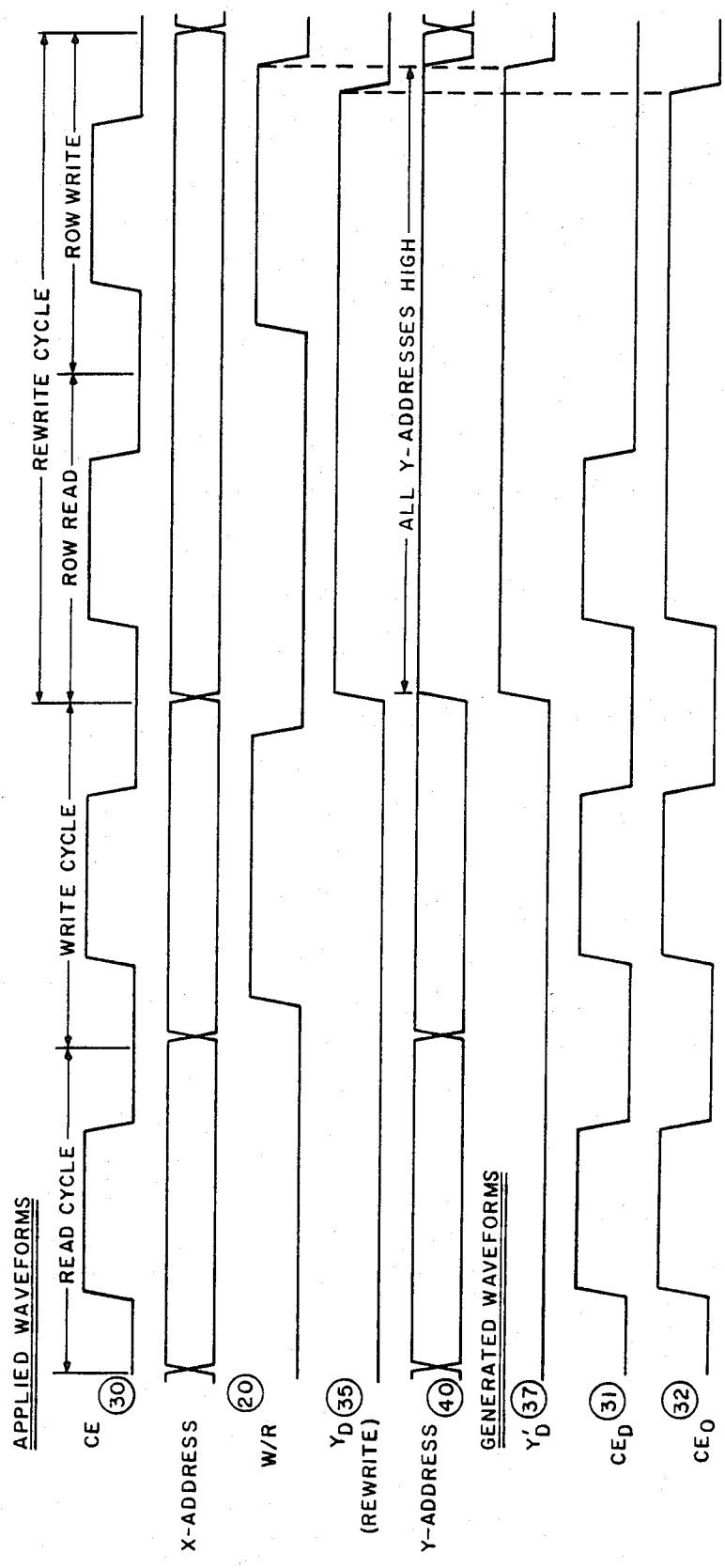
FIG. 5 is a timing diagram showing the operation of an array of memory cells according to the present invention.

The timing of the signals generated by the circuits discussed above is shown in FIG. 5.

The X decoder circuitry is a conventional CMOS NAND gate implementation of the seven bit to 128 line decoder. The decoder is also connected to the CE line, which effectively defeats the decoder, holding all lines low. This allows the potentials on the appropriate column to be set up before the individual cell is accessed. The Y circuitry is a NAND gate five bit to 32 line decoder. This decoder has the rewrite pulse line added so that the decoder can be defeated. In this case all the Y outputs go high so that every bit on each row can be simultaneously read or written.

The array operation will now be discussed in greater detail.

READ CYCLE

The X and Y addresses are selected with the read/write line at read, $Y_D$ remains OFF.

Under these conditions the Y selected column logic is in the read mode with the column read applied to the column through MN417 and the bit line pre-charging through MP433 and MN430. The sense amp is activated since MN224 is held off with node 413 being low. As $Y_D$, and therefore $Y_D'$, is low the latch is isolated from the sense amp and the O/P of the sense amp is connected to the O/P bus via MN 217 and MN218. The "write" section of the column logic is deactivated since nodes 410 and 408 and high and low respectively.

The reference generator is producing $V_{REF}$ in this mode since each dummy cell is being read. MN119 is "on" since node 123 is high, as is node 129. MP116 and MP120 are "on" thereby providing $V_{DD}$ for dummy cells.

CE now goes high. This enables the X-address and accesses the cell to be read. MN430 is now turned off so the load appears on the bit lines. (Note: For the X-decoder $CE_O$ ($CE_X$) is generated and for the Y $CE_D$ ($CE_Y$). In the read mode CE going high does not alter any other condition. The cell is now read.

CE now goes low, $CE_D$ and $CE_O$ follow CE. The accessed cell is now isolated. A new cell can be read or written.

WRITE CYCLE

The X and Y addresses are selected with the read line low and CE low, $Y_D$ remains low.

The write line now goes high. This disconnects the column read voltage from the column and turns MP433 "off"; it also disables all the sense amplifiers. The write circuitry of the selected Y column logic is also activated since nodes 410 and 408 are low and high respectively. This connects the data lines directly to the bit and column lines of the selected Y. (Note: Since $Y_D'$ is low devices MN400 and MN401 are "on", devices MN305 and MN306 are off.)

CE, and hence $CE_D$ and $CE_O$, go high. This enables the X-address and accesses the cell to be written. The latch remains isolated and although node 417 now goes low, the bit line can be taken to +15 V or 0 V since MP433 remains off during writing.

Note: When writing a selected column the O/P bus will always go high. This occurs because both MN217 and MN218 are "on". The O/P of the sense amp will be high because it is disabled by MN224 being "on". (This does not occur during rewrite since MN217 will be off.)

Depending upon the potential applied to the dummy read control, node 131, the dummy will remain generating $V_{REF}$ or it will be turned off during a normal write cycle. With node 131 low, node 129 is taken high and the dummy continues to generate $V_{REF}$. If node 131 is high, node 129 is taken low and the dummy is turned off.

REFRESH CYCLE

For rewriting an extra pulse is used, called the rewrite or Y override pulse, $Y_D$. Application of this pulse defeats the Y decoder and sets all the column addresses high.

The read/rewrite cycle is as follows:
Read/write line is set to read.
The X address is set, Y address is don't care.
$Y_D$ is set high so all the Y addresses are set high. $Y_D'$ follows $Y_D$ and therefore disables the data lines into each cell. The bit line is currently being preset and the column line is at the read potential. The output of each sense amp is disconnected from the O/P bus since MN217 is off. The latch remains isolated from the sense amp but is connected to the write line buffers, nodes 400 and 401.

CE now goes high and with it $CE_D$ and $CE_O$. This accesses the X address to a single row of cells. $CE_D$ going high accesses the latch at the O/P of each sense amp, i.e. each cell in the addressed X row is being read into the latch. The dummy continues to be read and generates $V_{REF}$.

Ce now goes low and with it $CE_D$, $CE_O$ remains high. $CE_D$ going low isolates the latches from the comparators, i.e. the read data is locked into the latches. (Note: MN430 is turned "on" by $CE_D$ going "off" and cell reading finishes. Therefore the read data must be locked into the latch before the "false data" is passed through the sense amp, i.e. the bit line being taken high by $CE_D$ going off. Considering the number of delay stages this should be OK.)

As was mentioned, CE going low does not turn the X address off, it remains high, held on by $Y_D$.

Set read/write to write. This writes the latched data back into the row of cells addressed by the Y-decoder. If the X line used by the dummy rewrite enable is high, node 90, the dummy is also rewritten at this time.

CE goes high once more. However, because $Y_D$ and R/W are currently high, CE to the column logic is defeated, i.e. $CE_D$ remains low. This allows the data that is currently being rewritten to remain isolated in the latch and to be unaffected by the comparator being reset. (The comparator was reset (MN224 turned "on") when the R/W line went high.) (If $CE_D$ did not remain low the gate between the comparator and latch, MN304, MP311, would turn on.)

CE goes low once more. $CE_O$ remains high, held on by $Y_D$. The cells therefore continue to be rewritten.

$Y_D$ now goes low. This isolates every cell in the memory, i.e. no row is addressed. This also stops the dummy being rewritten. Note: $Y_D$ going low does not turn off the feedback switches, MN305 and MN306, from the latch to the bit and column lines, they stay "on", held "on" by $Y_D'$ which is kept high by R/W being high.

Write goes low to read value. The feedback switches are turned off and the regular switches from the data bases turned "on".

Regular read or write cycle.

DUMMY CELL CYCLES

With the W/R low node 123 is high, therefore node 104 is at the column read voltage and MP118 is off. Node 122 is low, therefore MN117 is off and MP116 is on. $V_{DD}$ is therefore applied to the load. With the dummy read control at "0" 15 V is applied to node 129 through MP136, with it at a "1" node 126 is joined to 129, therefore MN101, 104, 108 and 111 are "on" and the two dummy cells are read. An average read signal appears at node 111 which is buffered by the unity gain amp at node 154.

If the dummy read control is at a "0" the dummy cells remain in the read mode since node 123 is at "1", 122 is at "0" and 129 is at "1". If the DRC is at a "1" node 126 is at a "0" and therefore so is node 129. This means that the dummy is not read and $V_{REF}$ is not generated. This mode of operation has been included to ascertain whether deterioration in the reference circuitry occurs if the nonvolatile transistors are read continuously during read and write.

The dummy is rewritten when $Y_D$, W/R and $X_N$ are all high. ($X_N$ is a single decoded X address.) At this time node 123 is low therefore node 129 is high independent of the DRC line potential. Since 123 is low node 104 is high and node 122 is high, therefore node 100 is low and MP116 is off.

This dummy cell is therefore written with a $+V_T$ since the NV gate is taken high and the tank low.

The other dummy cell has its column line taken to GND since MN122 is "on" and MN123 is "off". MP120 is "off" and MP121 is "on", therefore the bit line is taken high. In this case the dummy is written with a $-V_T$, i.e. the NV gate is low and the tank high.

On the dummy cell that is written with a $-V_T$ node 117 is taken to $V_{DD}$. Since the NV device in this cell has been programmed hand "off", node 117 tends to float at 15 V and the correct reference voltage is not produced on the next read cycle. To prevent node 117 from floating at 15 V extra circuitry is included in this dummy so that the $Y_D$ low and R/W, $X_N$ high and $Y_D'$ high node 117 is discharged to the column read voltage. As soon as $Y_D'$ goes off (it goes off with W/R) node 117 can charge up through the load MP107 to produce the correct $-V_T$ O/P voltage.

Note: Node 117 only gets returned to the column read voltage at the end of a rewrite cycle and then only if $X_N$ is high, i.e. $X_N$, R/W and $Y_D'$ all have to be high.

During a rewrite cycle when $X_N$ has not been selected the dummy cells continue to be read, if DRC is high $V_{REF}$ will not be produced.

What we claim is:

1. A memory array comprising:
   a matrix of non-volatile memory cells arranged in rows and columns, each said cell comprising a multi-dielectric transistor having programmable first and second threshold voltage states;
   reference voltage means for providing a reference voltage intermediate between those provided by ones of said cells having said first threshold state and said second threshold state;
   a plurality of comparators, each having first and second inputs respectively connected to said cells in at least one of said columns of said matrix and to said reference voltage means;
   row select means for connecting said cells in one of said rows to respective ones of said comparators, each said comparator providing a digital output in accordance with the threshold voltage state of a respective one of said cells; and
   refresh means connected to said matrix for reading out and rewriting said cells of said matrix one row at a time, and said refresh means being periodically actuated.

2. The array of claim 1,
   wherein said refresh means comprises a plurality of latches respectively connected to said comparator outputs,
   wherein said respective latches latch the outputs of said respective comparators,
   and wherein said refresh means writes said respective latch outputs into said corresponding cells.

3. The array of claim 1, wherein said reference voltage means comprises:
   first and second reference memory cells, said reference memory cells being similar to said cells of said matrix and having said first and second threshold voltage states respectively; and
   voltage averaging means, connected to both said reference memory cells, for providing an average output intermediate between the respective outputs of said reference cells.

4. The array of claim 3, wherein said voltage averaging means comprises a resistive voltage averaging network.

5. The array of claim 3, wherein said refresh means rewrites said reference cells after every row of said cells in said matrix has been refreshed.

6. A reference voltage generator, for providing a reference voltage level for multi-dielectric non-volatile memories, comprising:
   first and second reference memory cells each containing a multi-dielectric non-volatile storage element;
   said reference memory cells each providing an output according to the high or low threshold state of said storage element;
   said respective storage elements of said respective cells having opposed threshold states;
   and means, connected to both said reference memory cells, averaging said outputs thereof together.

7. A memory array comprising:
   a matrix of non-volatile memory cells arranged in rows and columns, each said cell comprising a multi-dielectric transistor having programmable first and second threshold voltage states;
   refresh means connected to said matrix for reading out and rewriting said cells of said matrix one row at a time, and said refresh means being periodically actuated no more often than once per second.

* * * * *